(12) United States Patent
Jung et al.

(10) Patent No.: US 12,495,567 B2
(45) Date of Patent: Dec. 9, 2025

(54) POWER SEMICONDUCTOR DEVICE AND MANUFACTURING METHOD THEREOF

(71) Applicant: DB HiTek Co., Ltd., Bucheon-si (KR)

(72) Inventors: Ji Houn Jung, Seoul (KR); Dae Il Kim, Cheongji-si (KR); Han Seok Ko, Seoul (KR); Ung Bi Son, Bucheon-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 387 days.

(21) Appl. No.: 18/183,438

(22) Filed: Mar. 14, 2023

(65) Prior Publication Data

US 2024/0088260 A1 Mar. 14, 2024

(30) Foreign Application Priority Data

Sep. 8, 2022 (KR) .................. 10-2022-0114148

(51) Int. Cl.
| | |
|---|---|
| H10D 30/47 | (2025.01) |
| H10D 30/01 | (2025.01) |
| H10D 62/85 | (2025.01) |
| H10D 64/00 | (2025.01) |
| H10D 64/23 | (2025.01) |

(52) U.S. Cl.
CPC ......... *H10D 30/015* (2025.01); *H10D 30/475* (2025.01); *H10D 64/111* (2025.01); *H10D 64/251* (2025.01); *H10D 62/8503* (2025.01)

(58) Field of Classification Search
CPC .. H10D 30/015; H10D 30/475; H10D 64/111; H10D 64/251
See application file for complete search history.

(56) References Cited

U.S. PATENT DOCUMENTS

| | | | |
|---|---|---|---|
| 10,217,827 B2 | 2/2019 | Lee | |
| 10,707,311 B2 | 7/2020 | Lee | |
| 10,861,947 B2 | 12/2020 | Lee | |
| 2012/0061729 A1* | 3/2012 | Shibata | H10D 30/015 257/E29.246 |
| 2015/0028390 A1* | 1/2015 | Colino | H10D 30/015 257/194 |
| 2017/0330940 A1 | 11/2017 | Lee | |
| 2019/0115435 A1 | 4/2019 | Lee | |
| 2020/0287004 A1 | 9/2020 | Lee | |
| 2022/0123109 A1* | 4/2022 | Wong | H10D 64/251 |

FOREIGN PATENT DOCUMENTS

KR 20200068745 A 6/2020

\* cited by examiner

*Primary Examiner* — Daniel P Shook
(74) *Attorney, Agent, or Firm* — Central California IP Group, P.C.; Andrew D. Fortney

(57) ABSTRACT

A power semiconductor device and a method of manufacturing the power semiconductor device are disclosed. The power semiconductor device includes an isolation region at or in a bather layer in contact with or adjacent to a drain electrode to reduce or prevent current collapse between a gate electrode and the drain electrode.

11 Claims, 10 Drawing Sheets

POWER SEMICONDUCTOR DEVICE AND MANUFACTURING METHOD THEREOF

CROSS REFERENCE TO RELATED APPLICATION

The present application claims priority to Korean Patent Application No. 10-2022-0114148, filed Sep. 8, 2022, the entire contents of which are incorporated herein for all purposes by this reference.

BACKGROUND OF THE INVENTION

Field of the Invention

The present disclosure relates to a power semiconductor device. More particularly, the present disclosure relates to a power semiconductor device including an isolation region at or in a bather layer in contact with or adjacent to a drain electrode (e.g., of the power semiconductor device) to reduce or prevent a current collapse between a gate electrode (e.g., of the power semiconductor device) and the drain electrode.

DESCRIPTION OF THE RELATED ART

A nitride semiconductor material may be used in a semiconductor device able to withstand a high operating voltage and having a high output power, since the nitride semiconductor material has characteristics such as a high saturation electron velocity and a wide band gap. Particularly, gallium nitride (GaN) has a wider band gap and a higher breakdown electric field characteristic (e.g., breakdown voltage) than those of silicon and gallium arsenide (GaAs), so that a transistor containing the gallium nitride has an excellent breakdown voltage.

In addition, a gallium nitride-based device has higher electron mobility and a higher saturation velocity than that of a silicon-based device (which is currently and generally utilized), so that the gallium nitride-based device may operate at a relatively high frequency. In addition, such high electron mobility results in an improved on-resistance of a transistor device including gallium nitride, which can form a low loss switching element.

As such, since a GaN-based field effect transistor (PET) has advantages as a device capable of operating at a high frequency and high power, research thereon has been continuously conducted. There has been much research and development on such a GaN-based PET over the past few years, but there are still several problems to solve in relation to the reliability of GaN-based PET devices. One important issue among the problems relates to current collapse, caused by trapped carriers in the semiconductor channel of the device.

FIG. 1 is a partial cross-sectional view illustrating a conventional GaN-based power semiconductor device.

Hereinafter, a schematic structure and problems of a conventional GaN-based power semiconductor device 9 will be described with reference to the attached drawing.

Referring to FIG. 1, in a conventional GaN-based power semiconductor device 9, a voltage higher than the voltages applied to the source electrode 910 and the gate electrode 930 may be applied to the drain electrode 950. In this situation, carriers may be trapped between the gate electrode 930 and the drain electrode 950. Current collapse may occur due to the trapped carriers, and such current collapse may cause a 'memory' effect in which the conduction current of the device may vary according to the period of a previously applied voltage. For example, electrons may be trapped in the epitaxial and/or GaN layer 960 or at the interface between the epitaxial and/or GaN layer 960 and the dielectric layer 940 during transistor operation. At this time, the trapped electrons may deflect electrons moving through the channel, so that maximum current conduction through the 2DEG layer 970 may be difficult. This situation may cause an increase in the resistance of the channel.

In order to solve this problem, the present inventors provide a new power semiconductor device and a method of manufacturing the power semiconductor device that has an improved structure, and a detailed description will be described later.

Document of Related Art

Korean Patent Application Publication No. 10-2020-0068745, entitled "HIGH ELECTRON MOBILITY TRANSISTOR."

SUMMARY OF THE INVENTION

Accordingly, the present disclosure has been made keeping in mind the above problems occurring in the related art, and an objective of the present disclosure is to provide a power semiconductor device and a method of manufacturing the power semiconductor device, including an isolation region comprising an insulation material at or in a bather layer in contact with or adjacent to a drain electrode so that current collapse is prevented from occurring between a gate electrode and the drain electrode.

In addition, another objective of the present disclosure is to provide a power semiconductor device and a method of manufacturing the power semiconductor device including a field plate electrically or physically connected to a drain electrode on an insulation film so that the breakdown voltage is maintained, the power semiconductor device also being advantageous for high integration since the distance between the source electrode and the drain electrode is reduced, thereby increasing the on-resistance of the device.

The present disclosure may be implemented by one or more embodiments having some or all of the following configurations, to achieve one or more of the above-described objectives.

According to one or more embodiments of the present disclosure, there is provided a power semiconductor device including a substrate; a channel layer on the substrate; a bather layer on the channel layer; a capping layer having a first conductivity type on the bather layer; a gate electrode on the capping layer; a source electrode and a drain electrode spaced apart from the gate electrode and which may comprise ohmic contact regions on the bather layer; and an insulation film on the bather layer, wherein the bather layer is discontinuous from the source electrode (or a bottom portion thereof) to the drain electrode (or a bottom portion thereof).

According to the present disclosure, at least part of the insulation film may be between first and second discontinuous portions of the bather layer.

According to the present disclosure, the bather layer may have an isolation region between the gate electrode and the drain electrode, and the isolation region may include an insulation material.

According to the present disclosure, the power semiconductor device may further include a buffer layer between the substrate and the channel layer.

According to the present disclosure, the power semiconductor device may further include a field plate on the insulation film.

According to the present disclosure, there is provided a power semiconductor device including a substrate; a channel layer on the substrate, the channel layer comprising a first nitride-based semiconductor layer; a bather layer on the channel layer, the bather layer comprising a second nitride-based semiconductor layer different from the first nitride-based semiconductor layer; a gate electrode on the bather layer; a source electrode and a drain electrode spaced apart from the gate electrode and which may be ohmic contact regions on the bather layer; and an insulation film on the bather layer, wherein the bather layer includes a first region overlapping the gate electrode and the source electrode; an isolation region including an insulation material; and a second region spaced apart from the first region by the isolation region, the second region at least partially overlapping the drain electrode.

According to the present disclosure, the isolation region includes a plurality of isolation regions spaced apart from each other in a plan view (e.g., along a first or y-axis direction).

According to the present disclosure, the power semiconductor device may further include a field plate on the insulation film, the field plate being electrically connected to the drain electrode.

According to the present disclosure, the source electrode, the drain electrode, and the field plate may have a substantially identical thickness and a substantially identical resistivity (e.g., they may be formed substantially simultaneously, or in the same process or process sequence).

According to the present disclosure, the field plate may at least partially overlap the isolation region.

According to the present disclosure, there is provided a power semiconductor device including a substrate; a channel layer on the substrate, the channel layer comprising a first nitride-based semiconductor layer; a bather layer on the channel layer, the bather layer comprising a second nitride-based semiconductor layer different from the first nitride-based semiconductor layer, and the bather layer having an isolation region comprising an insulation material; a capping layer on the bather layer; a gate electrode on the capping layer; a source electrode and a drain electrode spaced apart from the gate electrode and which may be ohmic contact regions on the bather layer; an insulation film on the bather layer, the insulation film covering the capping layer and including an insulation material that is same as the insulation material in the isolation region; and a field plate on the insulation film, the field plate being in contact with or physically connected to the drain electrode.

According to the present disclosure, the bather layer may be configured such that a 2DEG layer in the channel layer is discontinuous below the drain electrode or a side adjacent to the drain electrode.

According to the present disclosure, the field plate may be separate from the gate electrode.

According to the present disclosure, between the gate electrode and the drain electrode, the isolation region may have a side not formed along a y-axis direction with respect to a same x coordinate value.

According to the present disclosure, the drain electrode may partially overlap the isolation region.

According to one or more embodiments of the present disclosure, there is provided a method of manufacturing a power semiconductor device, the method including forming a buffer layer on a substrate; forming a channel layer on the buffer layer, the channel layer comprising a first nitride-based semiconductor layer (such as GaN and so on); forming a bather layer on the channel layer, the bather layer comprising a second nitride-based semiconductor layer (such as AlGaN and so on) and an isolation region that includes an insulation material; forming a capping layer having a first conductivity type on the bather layer; forming a gate electrode on the capping layer; forming an insulation film on the bather layer; and forming a source electrode and a drain electrode on the bather layer.

According to the present disclosure, forming the isolation region comprises etching the bather layer in a location of or adjacent to the drain electrode, and filling the etched bather layer with the insulation material.

According to the present disclosure, the method may further include forming a field plate on the insulation film substantially simultaneously with the source electrode and the drain electrode, the field plate being in contact with or connected to the drain electrode.

According to the present disclosure, the field plate may at least partially overlap the isolation region.

According to the present disclosure, the isolation region may include a plurality of isolation regions spaced apart from each other (e.g., along a first or y-axis direction).

According to the above configurations, the present disclosure has the following effects.

In the present disclosure, the isolation region comprising the insulation material at the bather layer in contact with or adjacent to the drain electrode reduces or prevents current collapse between the gate electrode and the drain electrode.

In addition, in the present disclosure, the field plate electrically or physically connected to the drain electrode on the insulation film maintains the breakdown voltage, and the power semiconductor device is also advantageous for integration (e.g., with other devices) since the distance between the source electrode and the drain electrode is reduced, so that the on-resistance of the device may increase.

Meanwhile, though not explicitly mentioned, effects described in the present specification and tentative effects expected from the technical features of the present specification will be treated as if described in the present disclosure.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in detail with reference to accompanying drawings. Various changes to the following embodiments are possible and the scope of the present disclosure is not limited to the following embodiments. The patent right of the present disclosure should be defined by the scope and spirit of the present disclosure as disclosed in the accompanying claims. In addition, embodiments of the present disclosure are intended to fully describe the present disclosure to a person having skill in the art to which the present disclosure pertains.

As used in this specification, a singular form may, unless definitely indicating a particular case in context, include a plural form. Also, the expressions "comprise" and/or "comprising" used in this specification include the mentioned shapes, numbers, steps, operations, members, elements, and/or groups thereof, but do not exclude the presence or addition of one or more other different shapes, numbers, steps, operations, members, elements, and/or groups thereof.

Hereinafter, when a component (or a layer) is described as being on another component (or another layer), it should be understood that the component may be directly on the other component, or one or more intervening components (or layers) are also present. In contrast, when a component is described as being directly on another component, it should be understood that there is (are) no intervening component(s) present. In addition, the terms indicating relative positions, such as 'on', 'above', 'below', 'upper side', 'lower side', 'first side', and 'side surface,' are intended to refer to a relative position of the components.

Meanwhile, when an embodiment can be realized in a different manner, a function or an operation specified in a specific sequence can be executed in an order different from that specified in the sequence. For example, functions or operations of two consecutive blocks, or consecutive steps in a process or method, can be executed at substantially the same time or in a reverse order.

Hereinafter, for example, a first conductivity type impurity region may comprise a 'P-type' doped region, and a second conductivity type impurity region may comprise an 'N-type' doped region. Otherwise, in some cases, a first conductivity type impurity region may comprise an 'N-type' doped region and a second conductivity type impurity region may comprise a 'P-type' doped region, but there is no limitation.

In addition, hereinafter, it should be understood that an 'x-axis direction' is a horizontal direction in the plan view according to FIG. 2 and a 'y-axis direction' is a vertical direction orthogonal to the 'x-axis direction'.

Figure 2:
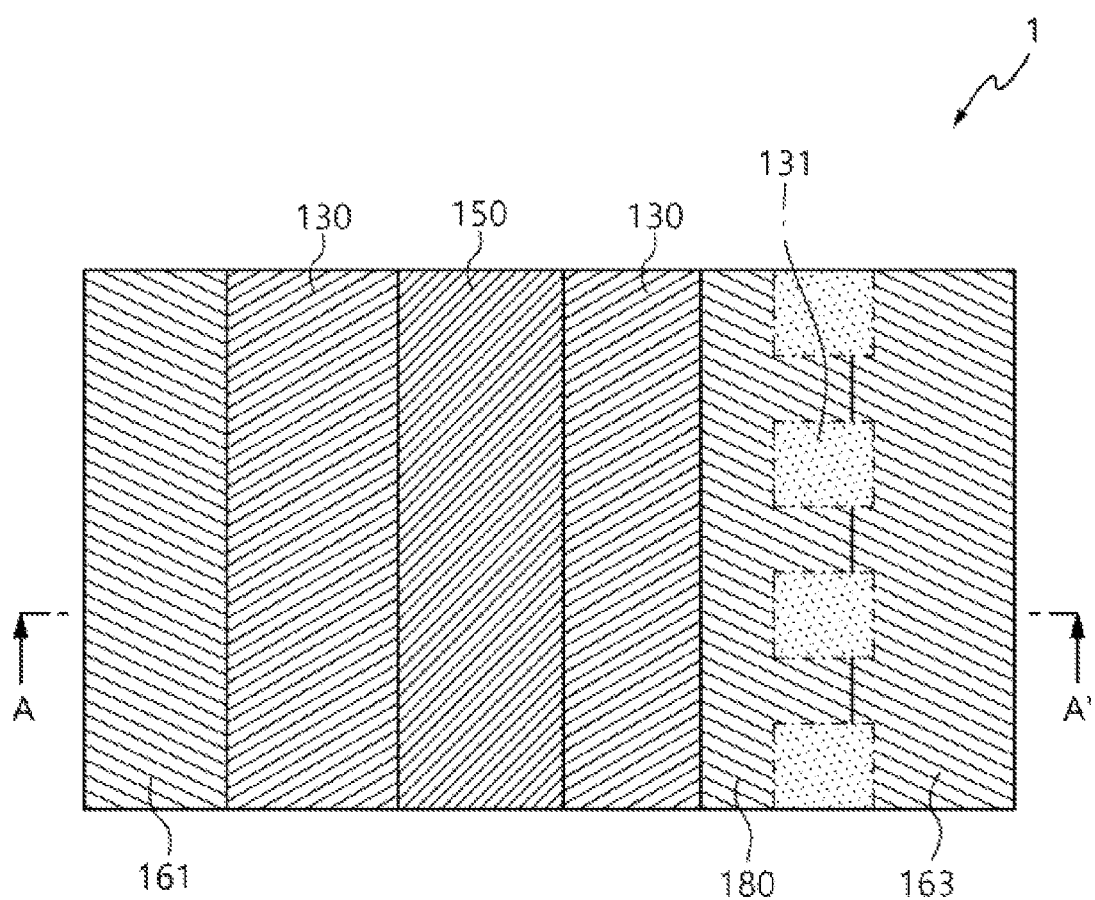
FIG. 2 is a plan view illustrating a power semiconductor device according to one or more embodiments of the present disclosure.
Figure 3:
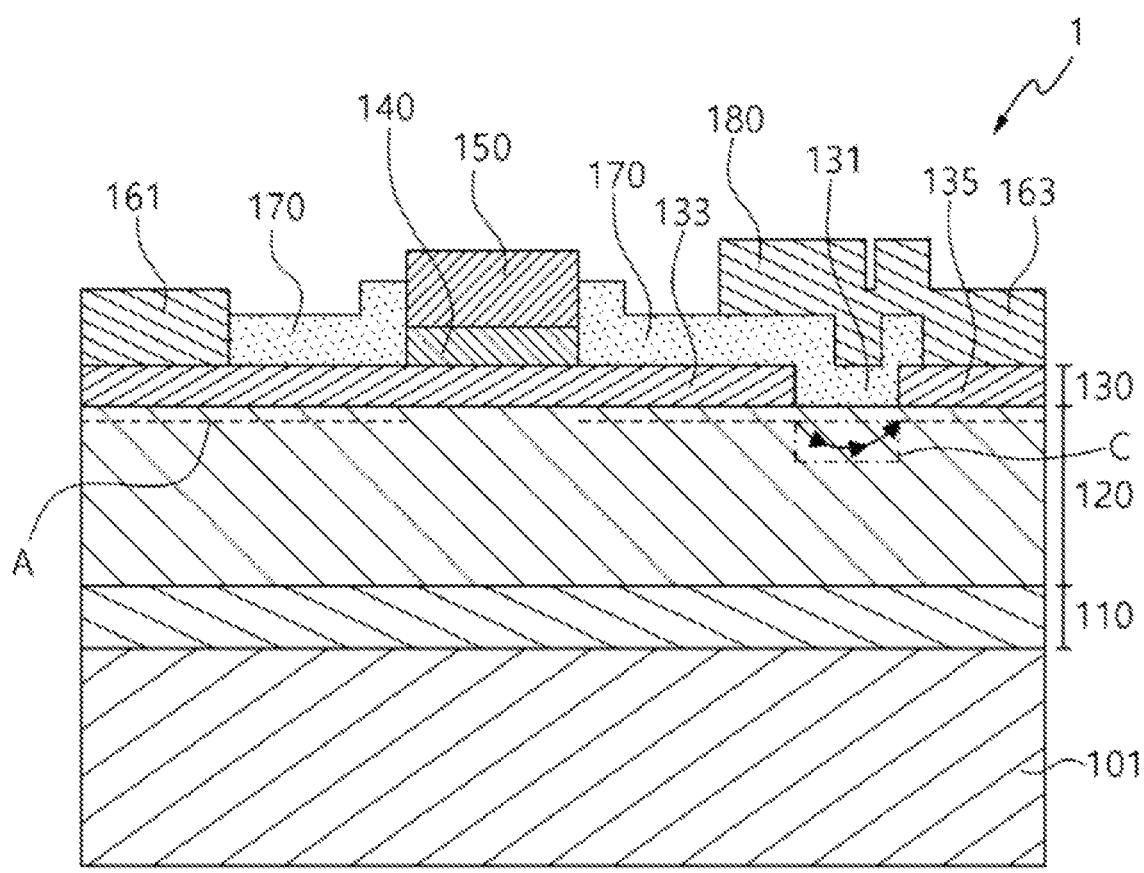
FIG. 3 is a cross-sectional view illustrating the power semiconductor device taken along line A-A' in FIG. 2.

FIG. 2 is a plan view illustrating a power semiconductor device according to one or more embodiments of the present disclosure, and FIG. 3 is a cross-sectional view illustrating the power semiconductor device taken along line A-A' in FIG. 2. For the convenience of understanding, it should be noted that the illustration of an insulation film 170 is omitted in the plan view of FIG. 2.

Hereinafter, a power semiconductor device 1 according to one or more embodiments of the present disclosure will be described in detail with reference to the accompanying drawings.

Referring to FIGS. 2 and 3, the present disclosure relates to the power semiconductor device 1. More particularly, the present disclosure relates to the power semiconductor device 1 including an isolation region 131 at or in a bather layer 130, in contact with or adjacent to a drain electrode 163, that reduces or prevents current collapse between the gate electrode 150 and the drain electrode 163.

To this end, the power semiconductor device 1 may include a substrate 101, a buffer layer 110, a channel layer 120, the bather layer 130, a capping layer 140, the gate electrode 150, a source electrode 161, the drain electrode 163, the insulation film 170, and a field plate 180.

The substrate 101 comprises a substrate on which a semiconductor layer may be formed (e.g., by epitaxial growth), and may comprise a silicon wafer or other similar substrate as an example, but is not limited thereto. For example, the substrate 101 may comprise a sapphire substrate, a GaN substrate, or a SiC substrate. In the present disclosure, an example in which the substrate 101 is a silicon substrate will be described.

The buffer layer 110 is on the substrate 101 and, for example, may be formed by growing AlN (e.g., epitaxially) to a predetermined thickness. Otherwise, the buffer layer 110 may comprise at least one composite layer of GaN and AlGaN (each of which may be, e.g., formed by epitaxial growth), but is not limited thereto. Such a buffer layer 110 may prevent stress caused by differences in lattice constants and/or thermal expansion coefficients between the substrate 101 and the channel layer 120 (e.g., to be described later). The buffer layer 110 may be doped with impurities such as C and/or Fe.

The channel layer 120 is on the substrate 101. More preferably, the channel layer 120 is on the buffer layer 110. For example, the channel layer 120 may comprise a Group III nitride-based semiconductor layer such as GaN, InN and so on. In addition, the bather layer 130 is on the channel layer 120, and may comprise a Group III nitride-based semiconductor layer such as AlGaN, intrinsic AlN or GaN, and so on as an example. It is preferable that the channel layer 120 and the bather layer 130 comprise different Group III nitride-based semiconductor layers. With such a structure, a 2-dimensional electron gas (2DEG) layer A may form near an interface between the channel layer 120 and the bather layer 130. The density and mobility of the 2DEG layer A may be controlled by controlling the content of Al and Ga in the bather layer 130. The 2DEG layer A may be in the channel layer 120. A channel region having a predetermined thickness may be near the interface between the bather layer 130 and the channel layer 120. That is, the 2DEG layer A and/or channel region may not be in all regions of the channel layer 120.

In addition, the bather layer 130 may have an opening or gap therein) in the region from the source electrode 161 to the drain electrode 163. That is, the bather layer 130 may be discontinuous on the channel layer 120. For example, the bather layer 130 in contact with the drain electrode 163 is at least partially disconnected (e.g., has an opening or gap under or overlapping the drain electrode 163). More specifically, the bather layer 130 under a side or sidewall of the drain electrode 163 that faces the gate electrode 150 is disconnected (e.g., the opening or gap in the bather layer 130 may be under the sidewall of the drain electrode 163 that faces the gate electrode 150). Otherwise, the bather layer 130 may be disconnected or discontinuous at an arbitrary position between the gate electrode 150 and the drain electrode 163. As such, an insulation material the same as or different from the insulation film 170 may be in the space where the bather layer 130 is disconnected (e.g., in the opening or gap), but there is no limitation.

The region where the bather layer 130 is disconnected and where the insulation material is may be referred to as the isolation region 131. As described above, the isolation region 131 and the drain electrode 163 may at least partially overlap vertically, or the isolation region 131 may be at an arbitrary position separate from the drain electrode 163 and the gate electrode 150, and there is no specific limitation.

In the presence of the isolation region 131, the bather layer 130 may include a first region 133 that extends from the source electrode 161, under or across the gate electrode 150, to a location adjacent to the drain electrode 163 (e.g., under the field plate 180), and a second region 135 spaced apart from the first region 133 (e.g., in a horizontal direction in FIG. 3) and which at least partially crosses or overlaps the drain electrode 163. The first region 133 and the second region 135 may be spaced apart from each other, or separated by the isolation region 131. For example, the isolation region 131 may be between the gate electrode 150 and the drain electrode 163, and may extend below the drain electrode 163 on the channel layer 120.

Referring to FIG. 2, a plurality of isolation regions 131 may be spaced apart from each other along a first (e.g., y-axis) direction at substantially the same position along an orthogonal direction (e.g., x-coordinate value). At this time, the distance by which adjacent isolation regions 131 are separated may be substantially the same (e.g., within an error range or margin), but there is no specific limitation. Alternatively, separation distances between the adjacent isolation regions 131 may be different from each other. Advantages of the isolation layer 131 will be described in detail below.

An etch stop film (not illustrated) may be on an upper surface of the bather layer 130. The etch stop film may be formed by depositing or epitaxially growing an AlN layer on the bather layer 130.

Referring to FIGS. 2 and 3, the capping layer 140 is on the bather layer 130 or the etch stop film, below the gate electrode 150. For example, it is preferable that the capping layer 140 comprises a first conductivity type dopant (e.g., in a Group III nitride semiconductor material) and has a positive polarity. When the capping layer 140 has at least a predetermined thickness, the distance from the gate electrode 150 to the 2DEG layer A may result in a reduced response speed. Conversely, when the capping layer 140 is less than the predetermined thickness, it may be difficult to ensure a normally-off configuration or operation. Therefore, preferably, the capping layer 140 has an appropriate thickness, typically within a range of 10 nm to 1000 nm, but there is no limitation. In addition, the capping layer 140 may be formed by epitaxially growing p-GaN on the bather layer 130, photolithographically patterning a mask over the epitaxial p-GaN (optionally after forming the gate layer for the gate electrode 150 on the epitaxial p-GaN), and etching the epitaxial p-GaN (and, when present, the gate layer for the gate electrode 150). In one example, the capping layer 140 may be doped with Mg.

The capping layer 140 is under the gate electrode 150, and the 2DEG layer A does not exist below the capping layer 140 when no operation is performed (e.g., the device 1 is off). Therefore, when a voltage on the gate electrode 150 turns the device 1 off, the 2DEG layer A does not exist in the channel layer 120, consistent with the normally-off configuration or operation. When the voltage on the gate electrode 150 turns the device 1 on, the 2DEG layer A may form, and the device 1 may operate (e.g., conduct a current).

For example, on the bather layer 130, the gate electrode 150 is on the capping layer 140, and may comprise a single layer or a composite layer of various metals such as Ti, Pd, and so on as an example. In addition, the gate electrode 150 is configured to be normally off (e.g., perform the normally-off operation), and the gate electrode 150 may cause a depletion layer to pass through the bather layer 130 and reach the channel layer 120, thereby blocking flow of carriers in the 2DEG layer A.

The source electrode 161 and the drain electrode 163 are on the bather layer 130, spaced apart from the gate electrode 150, and comprise ohmic contact regions. The source electrode 161 and the drain electrode 163 may have a cross-section with a step shape or a quadrangle shape, but it should be noted that the source electrode 161 and the drain electrode 163 may have other structural shapes. As an example, the source electrode 161, the gate electrode 150, and the drain electrode 163 may be spaced apart from each other sequentially along the horizontal direction, as shown in FIG. 3. In addition, as an example, the source electrode 161 and the drain electrode 163 may comprise a single layer or composite layers of various metals such as Ti, Au, Al, and so on, capable of ohmic contact, but there is no limitation.

As an example, the insulation film 170 may be an electrically insulative material. Such an insulation film 170 may be on the bather layer 130 and/or the etch stop film. In addition, the insulation film 170 may not cover the source electrode 161 or the drain electrode 163, or may cover parts of the source electrode 161 and the drain electrode 163. As an example, the insulation film 170 may be formed by depositing $Al_2O_3$ on the bather layer 130 such that the $Al_2O_3$ covers both the source electrode 161 and the drain electrode 163, and then forming openings (not illustrated) exposing the source electrode 161 and the drain electrode 163 (e.g., uppermost surfaces thereof). In addition, the insulation film 170 may fill the disconnected region below the drain electrode 163 to form the isolation region 131.

Hereinafter, in the power semiconductor device 1 according to embodiment(s) of the present disclosure, advantages that result from the isolation region 131 adjacent to the drain electrode 163 and/or between the drain electrode 163 and the channel layer 120 will be described in detail.

Figure 1:
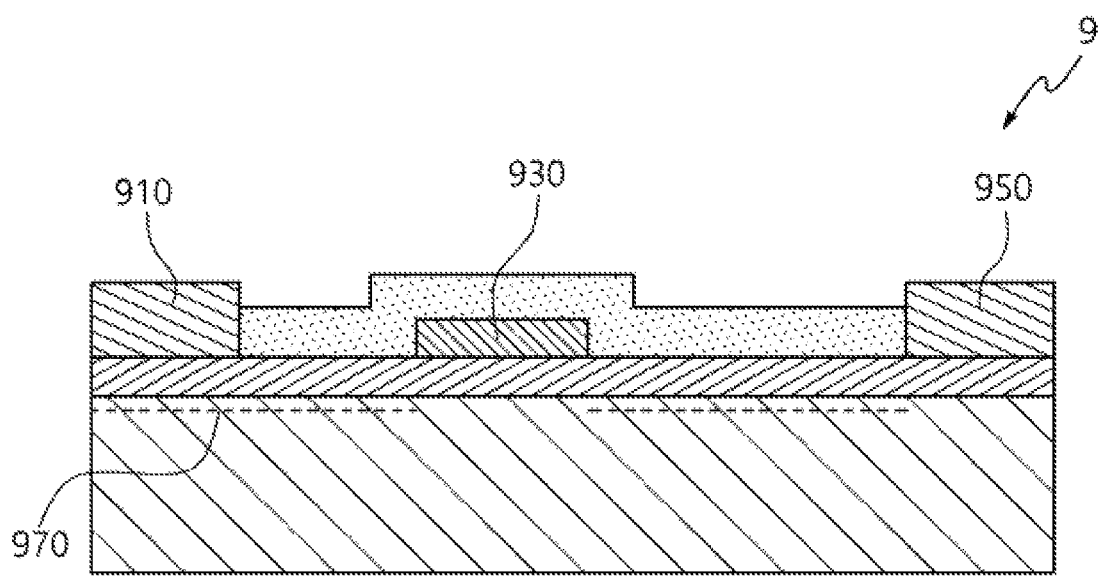
FIG. 1 is a partial cross-sectional view illustrating a conventional power semiconductor device.

Referring to FIG. 1, in a conventional GaN-based power semiconductor device 9, a voltage higher than the voltages applied to the source electrode 910 and the gate electrode 930 may be applied to the drain electrode 950. In this situation, carriers may be trapped between the gate electrode 930 and the drain electrode 950. Current collapse may occur due to trapped carriers, and such current collapse may cause a 'memory' effect in which the conduction current of the device may vary according to the period of a previously applied voltage. For example, electrons may be trapped in the epitaxial and/or GaN layer 960 or at the interface between the epitaxial and/or GaN layer 960 and the dielectric layer 940 during transistor operation. At this time, the trapped electrons may deflect electrons moving through the channel so that maximum current conduction through the 2DEG layer 970 may be difficult. This situation may cause an increase in the resistance of the channel.

In order to prevent such a problem, referring to FIGS. 2 and 3, the power semiconductor device 1 according to embodiment(s) of the present disclosure includes the isolation region 131 in the bather layer 130 on the channel layer 120, in contact with or adjacent to the drain electrode 163.

Referring to FIG. 2, the isolation regions 131 (e.g., along a second or x-axis direction), reduce or prevent trapped carriers in the channel 120 under and/or adjacent to the drain electrode 163, and the current path C of the carriers may be curved (see FIG. 3). That is, the isolation regions 131 may mitigate the effect of a high electric field at a corner of the drain electrode 163 on the 2DEG layer A below the drain electrode 163.

In describing a structure of the present disclosure with reference to FIG. 3, the field plate 180 is on the insulation film 170, and is configured to mitigate an electric field (e.g., on the channel 120) when a voltage is applied (e.g., on the field plate 180 and/or the drain electrode 163). Such a field plate 180 is on the insulation film 170 and, preferably, is physically and/or electrically connected to the drain electrode 163. In addition, the field plate 180 may comprise a single layer or a composite layer of various metals such as Ti, Au, Al, and so on, and may be formed substantially simultaneously with or in the same process or process sequence as the source electrode 161 and the drain electrode 163. Therefore, it is preferable that the field plate 180 comprises the same material as the source electrode 161 and the drain electrode 163, but the scope of the present disclosure is not limited thereto.

As described above, in the semiconductor device 1 according to one or more embodiments of the present disclosure, when the current path C curves as a result of the isolation region 131, the on-resistance Rsp of the device 1 may increase. In order to reduce or prevent this, the field plate 180 is on or over the isolation region 131 and is connected to the drain electrode 163, so that the breakdown voltage Bvdss of the device 1 is maintained. Also, the distance between the source electrode 161 and the drain electrode 163 can be reduced, so that it is advantageous for integration and, accordingly, the on-resistance Rsp of the device 1 may be increased or offset (e.g., by decreasing the distance between the source electrode 161 and the drain electrode 163).

FIGS. 4 to 12 are cross-sectional views illustrating a method of manufacturing the power semiconductor device according to one or more embodiments of the present disclosure.

Hereinafter, the method of manufacturing the power semiconductor device according to one or more embodiments of the present disclosure will be described in detail with reference to the accompanying drawings.

Figure 4:
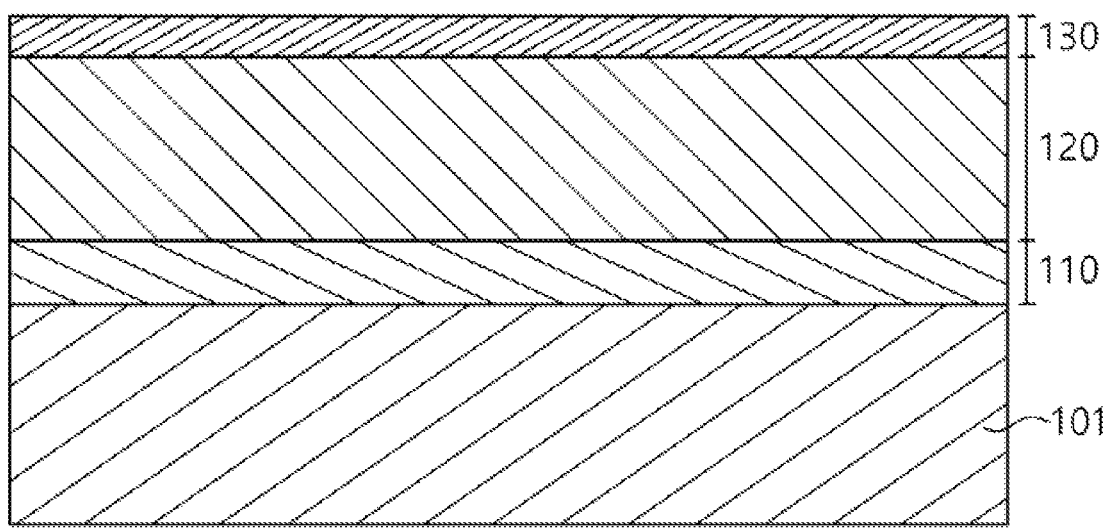
FIGS. 4 to 12 are cross-sectional views illustrating a method of manufacturing the power semiconductor device according to one or more embodiments of the present disclosure.

First, referring to FIG. 4, on the substrate 101, the buffer layer 110, the channel layer 120, and the bather layer 130 are sequentially formed. As described above, the substrate 101 is a substrate on which the buffer layer 110 may be epitaxially grown, and may comprise any one of a silicon substrate (e.g., a monolithic or single-crystal silicon wafer), a sapphire substrate, a GaN substrate, and a SiC substrate. In the present disclosure, an example in which the substrate 101 is a silicon substrate will be described. The buffer layer 110 may be formed by epitaxially growing an AlN layer on the substrate 101 to a predetermined thickness, as an example. The channel layer 120 may then be formed epitaxially growing an GaN layer on the buffer layer 110 by to a predetermined thickness, as an example. The bather layer 130 may then be formed by epitaxially growing an AlGaN layer on the channel layer 120 to a predetermined thickness, as an example.

In addition, the channel layer 120 comprises a first Group III nitride-based semiconductor layer such as GaN and so on, the bather layer 130 comprises a second Group III nitride-based semiconductor layer such as AlGaN and so on, and the 2DEG layer A (not illustrated) may be formed by electrons accumulating at or near an interface between the channel layer 120 and the bather layer 130. As a detailed description, piezo polarization may occur in the interface between the channel layer 120 and the bather layer 130 due to a difference in the lattice constants of the first and second Group III nitride-based semiconductor layers (e.g., GaN and AlGaN). Piezo polarization and/or spontaneous polarization of the channel layer 120 and the bather layer 130 may form or generate a two-dimensional electron gas (2DEG) that may have a high concentration of electrons at or near the interface of the channel layer 120 and the bather layer 130.

Then, the capping layer 140 may be formed on the bather layer 130. The capping layer 140 may be formed by growing a p-GaN layer epitaxially on the bather layer 130 to a predetermined thickness. As an example, when the GaN layer has a first conductivity type, the GaN may be doped with Mg by adding Mg (e.g., in a gas-phase form, such as bis[cyclopentadienyl]magnesium) to a source gas of GaN. In one embodiment, the etch stop film may be formed on the bather layer 130 before formation of the capping layer 140. The etch stop film may comprise a material that has a high selectivity for not being etched by the etchant used to etch the capping layer 140, and preferably, can be formed by epitaxial growth and can enable epitaxial growth of a Group III nitride semiconductor. For example, aluminum nitride may, under certain conditions, function as a suitable etch stop film.

Figure 5:
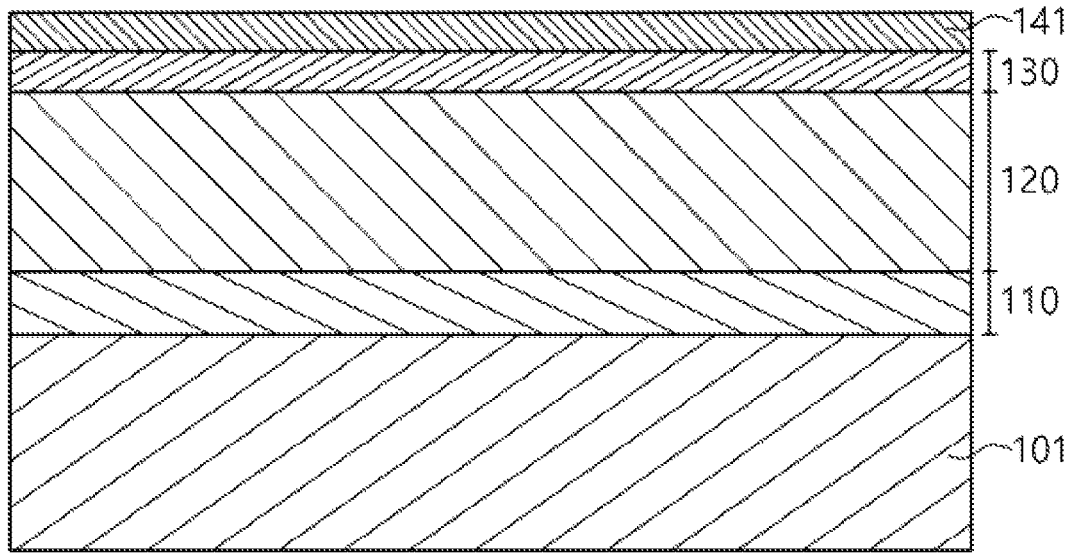
Figure 6:
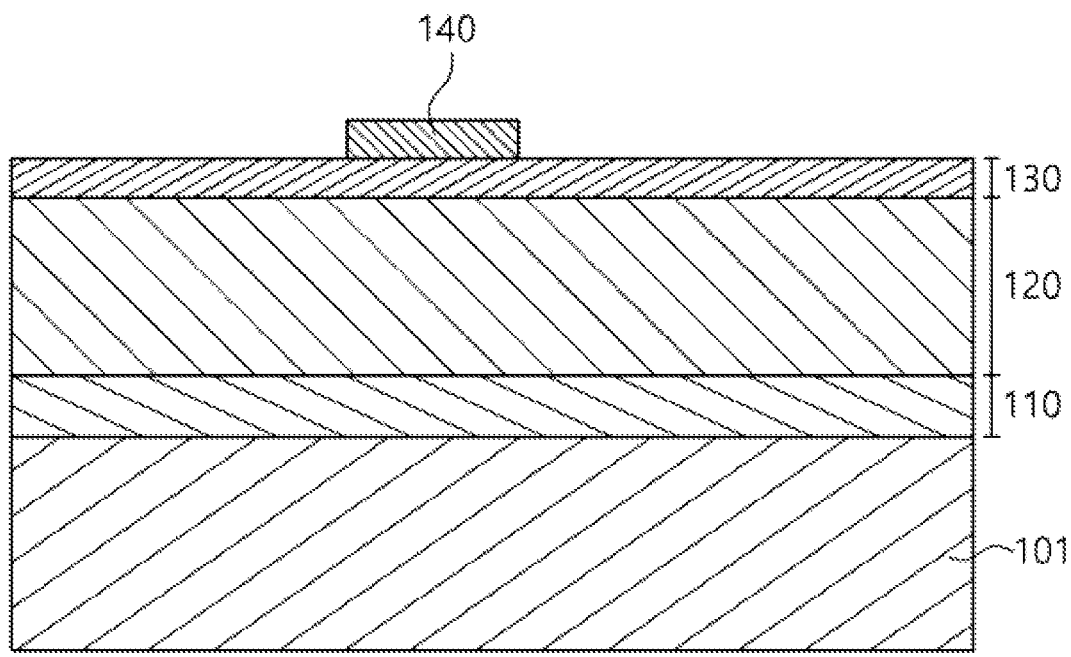

In describing an exemplary process of forming the capping layer 140 with reference to FIGS. 5 and 6, a first conductivity type doped GaN layer 141 is epitaxially grown on the bather layer 130 (see FIG. 5). Then, utilizing a mask pattern formed by conventional photolithographic patterning of a photoresist (not illustrated), the capping layer 140 may be formed by etching the doped layer 141 exposed through openings in the mask pattern.

Afterwards, the isolation region 131 may be formed in the bather layer 130. More specifically, the isolation region 131 is spaced apart by a predetermined distance from a position where the gate electrode 150 will be formed, and may at least partially and vertically overlap a position where the drain electrode 163 may be formed and/or a position adjacent thereto. For example, preferably, the isolation region 131 is at a position under a sidewall of the drain electrode 163 facing the gate electrode 150. As a result, the sidewall of the drain electrode 163 is over the isolation region 131.

Figure 7:
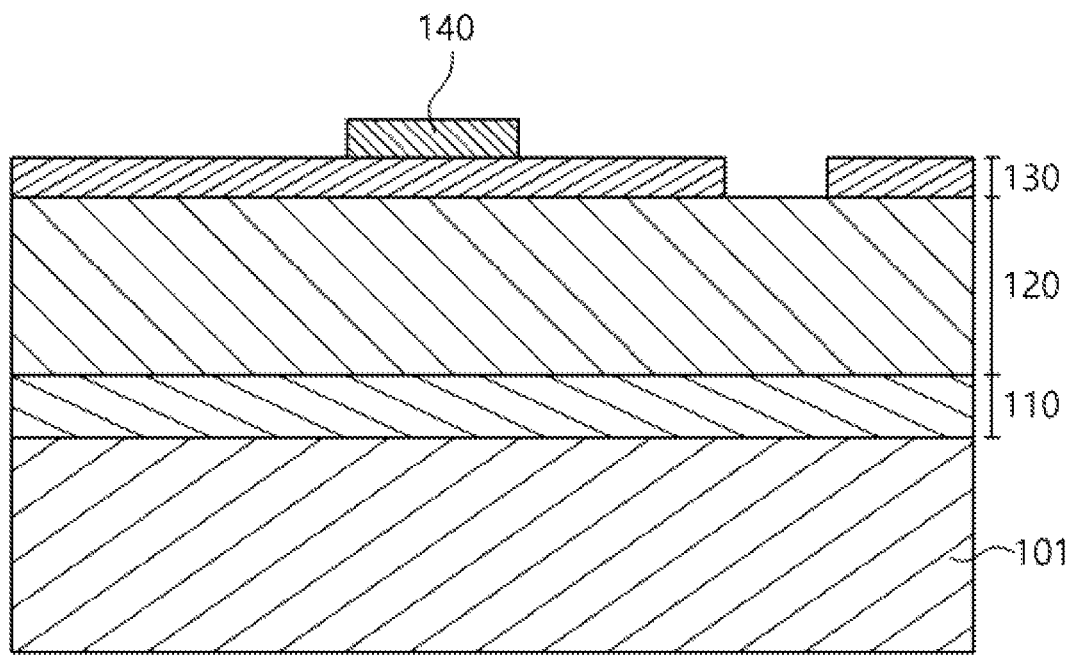

The process of forming the isolation region 131 will be described. Referring to FIG. 7, a mask pattern (not illustrated) having one or more openings in locations of the isolation region(s) 131 is formed on the bather layer 130, and then the bather layer 130 is etched through the openings in the mask pattern to form an opening or gap 132 in the bather layer 130. Then, referring to FIG. 8, an insulation film or layer 171 is formed on the bather layer 130 such that the insulation film or layer 171 covers the capping layer 140. Such an insulation film or layer 171 may be formed by conventionally depositing $Al_2O_3$ as an example. The insulation film or layer 171 may fill the opening or gap 132 in the bather layer 130. Therefore, the 2DEG layer A may be partially isolated below the isolation region 131.

Figure 8:
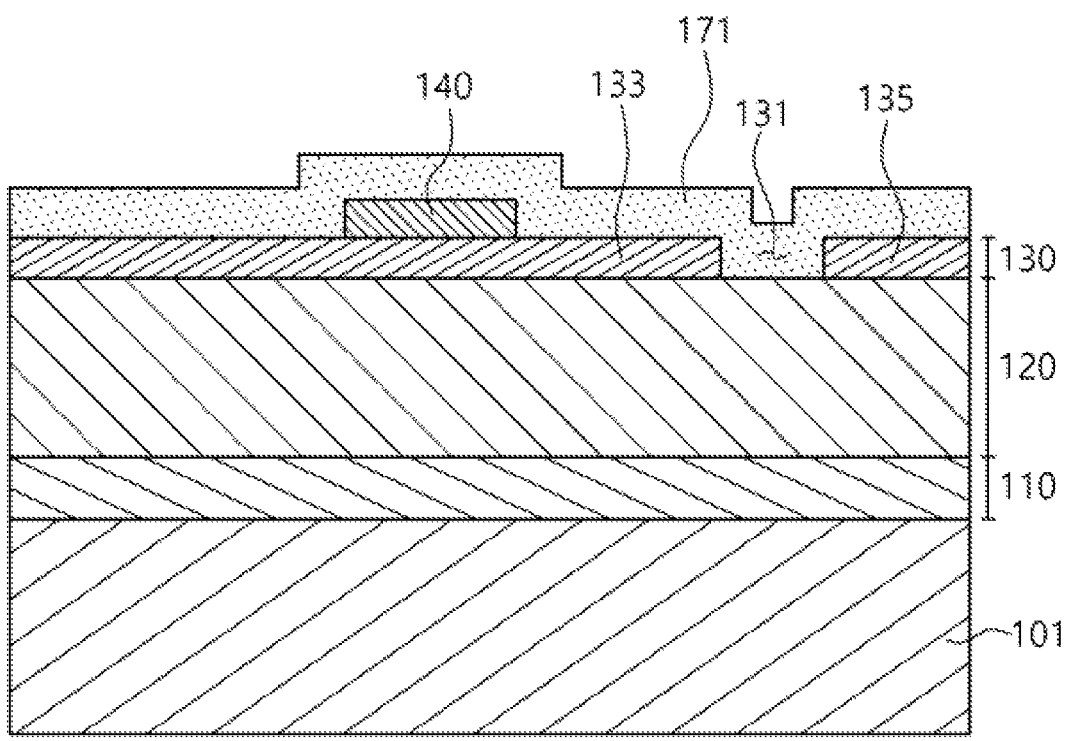

By this process, the first region 133 and the second region 135 (separate from the first region 133) may be formed in the bather layer 130. The first region 133 crosses under the capping layer 140 and the gate electrode 150 and extends to a position adjacent to the drain electrode 163, and the second region 135 may be spaced apart from the first region 133 by the isolation region 131 (e.g., along a horizontal or side direction as shown in FIG. 8).

Figure 9:
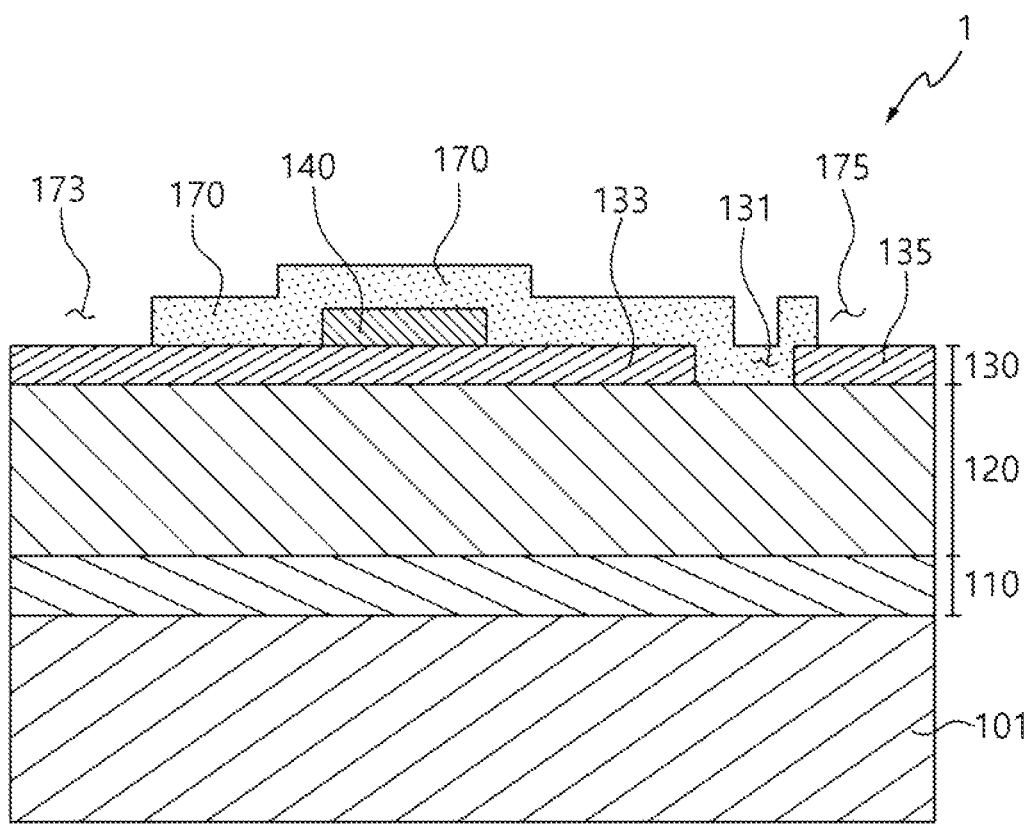

Referring to FIG. 9, in a subsequent process, openings 173 and 175 exposing areas of the first region 133 and the second region 135 are formed at positions of the source electrode 161 and the drain electrode 163, respectively. The openings 173 and 175 may be formed by forming a mask pattern (not illustrated) on the insulation film or layer 171 by conventional photolithography and development, then etching the portions of the insulation film or layer 171 exposed by the mask pattern.

In a subsequent process, the source electrode 161, the drain electrode 163, and the field plate 180 are formed. The source electrode 161 may be formed on the bather layer 130 (e.g., the first region 133), the drain electrode 163 may be formed on the second region 135 and the isolation region 131, or the drain electrode 163 may be in contact with the isolation region 131, but there is no limitation.

Figure 10:
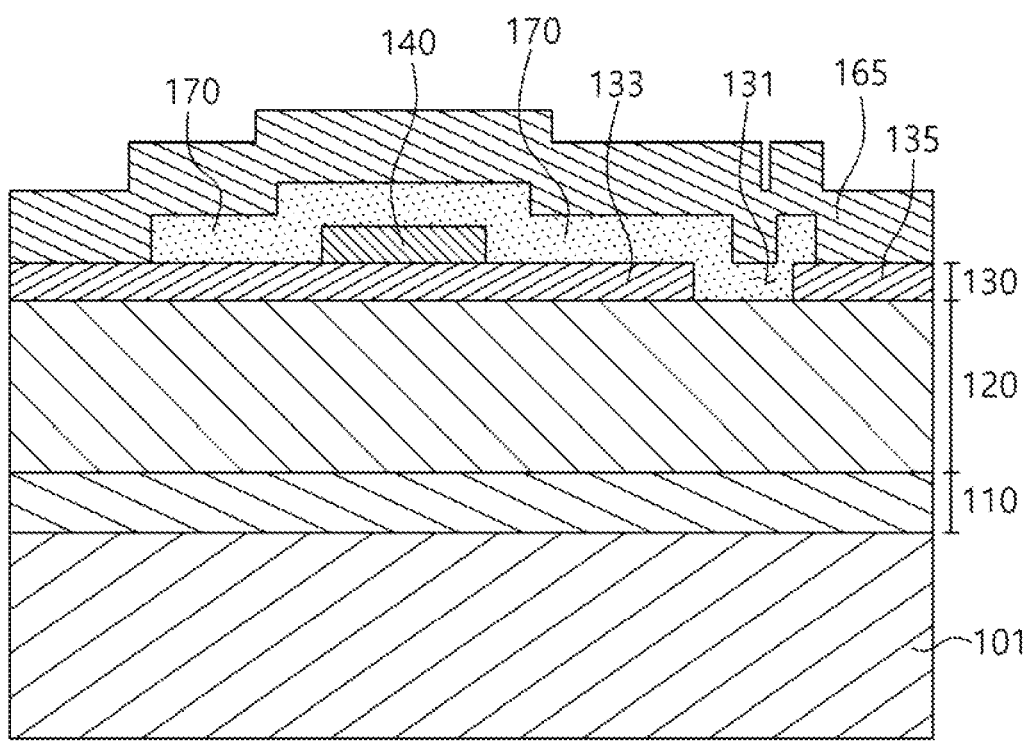
Figure 11:
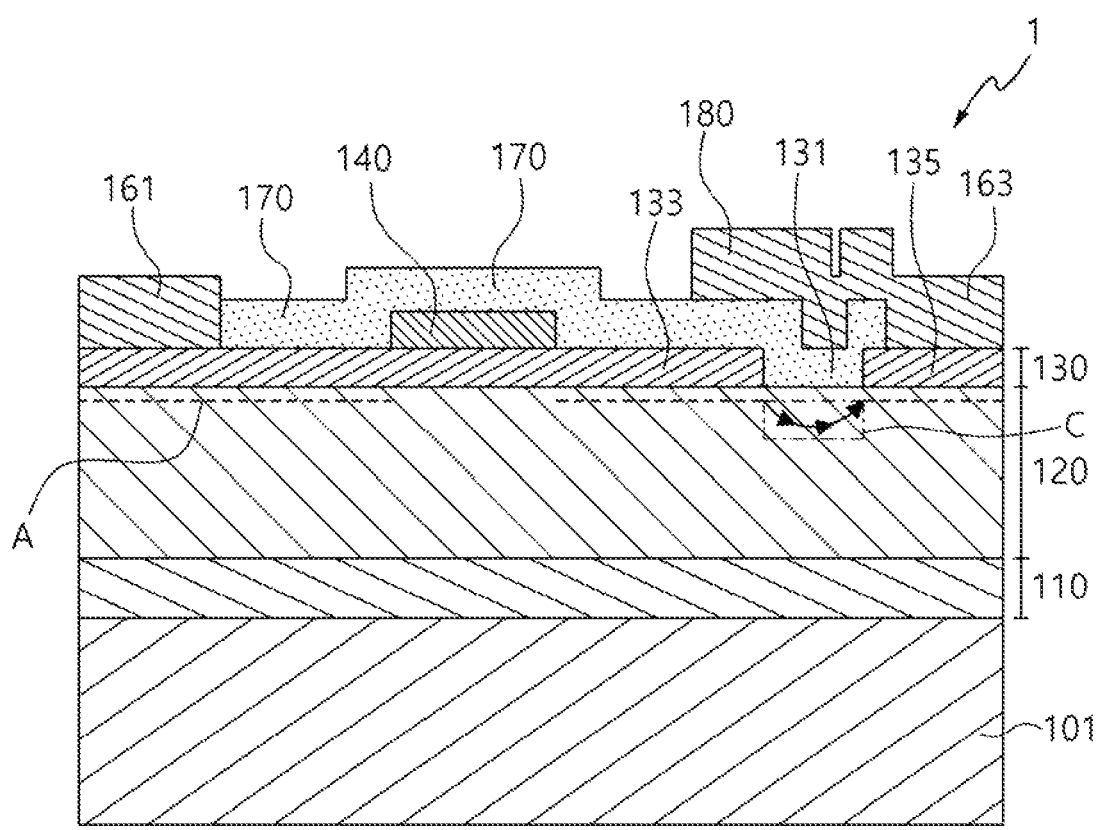
Figure 12:
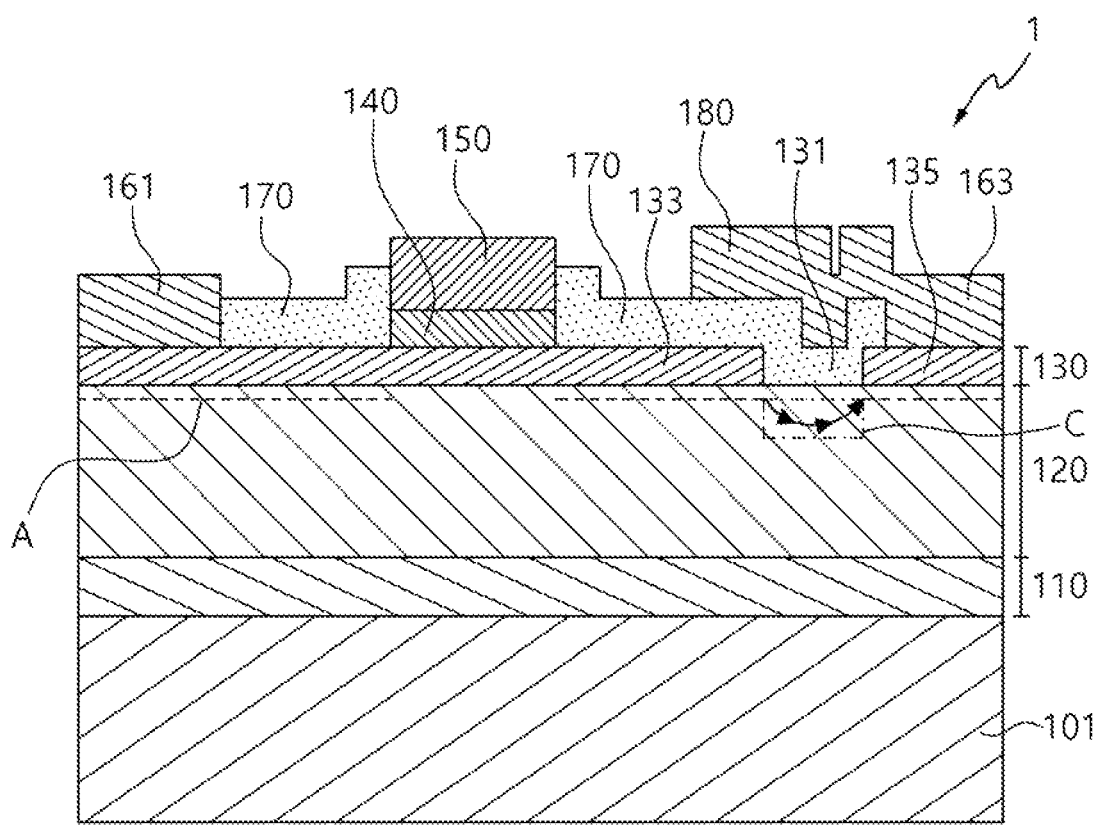

In describing a formation process of the source electrode 161, the drain electrode 163, and the field plate 180 in detail with reference to FIGS. 10 and 11, a metal layer 165 is deposited on the insulation film 170 such that the openings 173 and 175 are filled and/or the exposed areas of the first region 133 and the second region 135 are covered (see FIG. 10), and then a mask pattern (not illustrated) is formed on the metal layer 165 by conventional photolithography and development. The metal layer 165 is then partially removed by etching using the mask pattern (see FIG. 11). Through this process, the source electrode 161, the drain electrode 163, and the field plate 180 may be formed.

In a subsequent process, the gate electrode 150 is formed. In forming the gate electrode 150, after the source electrode 161, the drain electrode 163, and the field plate 180 are formed, an additional insulation film (not illustrated) is formed on the source electrode 161, the drain electrode 163, the field plate 180 and the insulation film 170 (e.g., by conventional blanket deposition), and then an opening (not illustrated) is formed in the additional insulation film by conventional photolithographic patterning of a photoresist to form a mask, and etching the area of the additional insulation film exposed through the mask. Such an opening may be formed at a position exposing an upper surface of the capping layer 140. Then, a metal layer (not illustrated) is deposited on the additional insulation film and the exposed surface of the capping layer 140 so as to fill the opening in the additional insulation film, and then the gate electrode 150 may be formed by removing the metal layer outside the opening in the additional insulation film (e.g., by selective anisotropic etching or etchback; see FIG. 12).

The foregoing detailed description is for illustrative purposes only. Further, the description provides embodiments of the present disclosure, and the present disclosure may be used in other various combinations, changes, and environments. That is, the present disclosure may be changed or modified within the scope of the present disclosure described herein, a range equivalent to the description, and/or within the knowledge or technology in the related art. The embodiments show an optimum state for achieving the spirit of the present disclosure and may be changed in various ways for various applications or fields of use. Therefore, the detailed description of the present disclosure is not intended to limit the present disclosure to the embodiments.

What is claimed is:

1. A power semiconductor device comprising:
a substrate;
a channel layer on the substrate;
a barrier layer on the channel layer, wherein the barrier layer comprises a plurality of isolation regions spaced apart from each other in a plan view, and each of the plurality of isolation regions comprises an insulation material;
a capping layer having a first conductivity type on the barrier layer;
a gate electrode on the capping layer;
a source electrode and a drain electrode on the barrier layer, spaced apart from the gate electrode;
an insulation film on the barrier layer, and
a field plate on the insulation film, the field plate being electrically connected to the drain electrode,
wherein the barrier layer is discontinuous from the source electrode to the drain electrode.

2. The power semiconductor device of claim 1, wherein at least part of the insulation film is between first and second discontinuous portions of the barrier layer.

3. The power semiconductor device of claim 1, further comprising
a buffer layer between the substrate and the channel layer.

4. A power semiconductor device comprising:
a substrate;
a channel layer on the substrate, the channel layer comprising a first nitride-based semiconductor layer;
a barrier layer on the channel layer, the barrier layer comprising a second nitride-based semiconductor layer different from the first nitride-based semiconductor layer;
a gate electrode on the barrier layer;
a source electrode and a drain electrode on the barrier layer, spaced apart from the gate electrode;
an insulation film on the barrier layer, and
a field plate on the insulation film, the field plate being electrically connected to the drain electrode,
wherein the barrier layer comprises:
a first region overlapping the gate electrode and the source electrode;
a plurality of isolation regions spaced apart from each other in a plan view, wherein each of the plurality of isolation regions comprises an insulation material; and
a second region spaced apart from the first region through the isolation region, the second region at least partially overlapping the drain electrode.

5. The power semiconductor device of claim 4, wherein the source electrode, the drain electrode, and the field plate have a substantially identical thickness and a substantially identical resistivity.

6. The power semiconductor device of claim 4, wherein the field plate at least partially overlaps the isolation region.

7. A power semiconductor device comprising:
a substrate;
a channel layer on the substrate, the channel layer comprising a first nitride-based semiconductor layer;
a barrier layer on the channel layer, the barrier layer comprising a second nitride-based semiconductor layer different from the first nitride-based semiconductor layer, and the barrier layer having an isolation region comprising a first insulation material;
a capping layer on the barrier layer;
a gate electrode on the capping layer;
a source electrode and a drain electrode on the barrier layer, spaced apart from the gate electrode;
an insulation film on the barrier layer, the insulation film covering the capping layer and comprising a second insulation material identical to the first insulation material; and
a field plate on the insulation film, the field plate being in contact with or physically connected to the drain electrode.

8. The power semiconductor device of claim 7, wherein the barrier layer is discontinuous below the drain electrode or a side adjacent to the drain electrode.

9. The power semiconductor device of claim 7, wherein the field plate is separate from the gate electrode.

10. The power semiconductor device of claim 7, wherein, between the gate electrode and the drain electrode, the isolation region has a side not formed along a y-axis direction with respect to a same x coordinate value.

11. The power semiconductor device of claim 7, wherein the drain electrode partially overlaps the isolation region.

* * * * *